(12) United States Patent
Aoki et al.

(10) Patent No.: US 7,262,544 B2
(45) Date of Patent: Aug. 28, 2007

(54) DIELECTRIC ELEMENT, PIEZOELECTRIC ELEMENT, INK JET HEAD AND METHOD FOR PRODUCING THE SAME HEAD

(75) Inventors: Katsumi Aoki, Yokohama (JP);
Kenichi Takeda, Yokohama (JP);
Tetsuro Fukui, Yokohama (JP);
Hiroshi Funakubo, 3-5-4-305, Miyamaetaira 1-chome, Miyamae-ku, Kawasaki-shi, Kanagawa-ken (JP);
Shoji Okamoto, Matsuyama (JP); Goji Asano, Nagareyama (JP)

(73) Assignees: Canon Kabushiki Kaisha, Tokyo (JP);
Hiroshi Funakubo, Kawasaki-shi (JP)

( * ) Notice: Subject to any disclaimer, the term of this patent is extended or adjusted under 35 U.S.C. 154(b) by 35 days.

(21) Appl. No.: 11/024,961

(22) Filed: Dec. 30, 2004

(65) Prior Publication Data
US 2005/0168112 A1 Aug. 4, 2005

(30) Foreign Application Priority Data
Jan. 9, 2004 (JP) .............................. 2004-004748

(51) Int. Cl.
*B41J 2/01* (2006.01)
*H01L 41/047* (2006.01)

(52) U.S. Cl. .................. 310/363; 310/364; 347/68; 347/72

(58) Field of Classification Search ................ 310/328, 310/331, 363, 364; 347/68, 70–72; *H01L 41/08*
See application file for complete search history.

(56) References Cited

U.S. PATENT DOCUMENTS

| 6,653,211 B2 | 11/2003 | Unno et al. |
| 6,841,490 B2 | 1/2005 | Unno et al. |
| 6,969,157 B2* | 11/2005 | Tomozawa et al. ........... 347/68 |
| 7,120,978 B2* | 10/2006 | Wasa et al. ................. 29/25.35 |
| 2002/0076875 A1 | 6/2002 | Wasa et al. |
| 2002/0140320 A1 | 10/2002 | Unno et al. |
| 2003/0008179 A1 | 1/2003 | Lee et al. |
| 2003/0196745 A1 | 10/2003 | Fukui et al. |
| 2003/0222947 A1* | 12/2003 | Tomozawa et al. ........... 347/68 |
| 2004/0066116 A1 | 4/2004 | Matsuda et al. |
| 2004/0135144 A1 | 7/2004 | Yamada et al. |

FOREIGN PATENT DOCUMENTS

EP  1 018 771  7/2000

(Continued)

OTHER PUBLICATIONS

EPO Office Action dated Nov. 15, 2006 issued in counterpart foreign application no. 05000307.8 (in English).

*Primary Examiner*—Thomas M. Dougherty
(74) *Attorney, Agent, or Firm*—Fitzpatrick, Cella, Harper & Scinto

(57) ABSTRACT

To provide a dielectric layer of crystal structure preferentially or uniaxially oriented on a common substrate.

A dielectric element of desired quality can be stably produced even on a common substrate for film-making by forming a lower electrode layer, dielectric layer and upper electrode layer in this order on a substrate, wherein each of these layers are designed to be preferentially or uniaxially oriented, and to have a specific half bandwidth, determined by fitting a pseudo-Voigt function.

13 Claims, 8 Drawing Sheets

FOREIGN PATENT DOCUMENTS

| | | | |
|---|---|---|---|
| EP | 1 168 465 | | 2/2002 |
| EP | 1168465 | * | 2/2002 |
| JP | 8-116103 | | 5/1996 |
| JP | 2003-179278 | | 6/2003 |
| WO | WO 02/093740 | | 11/2002 |

* cited by examiner

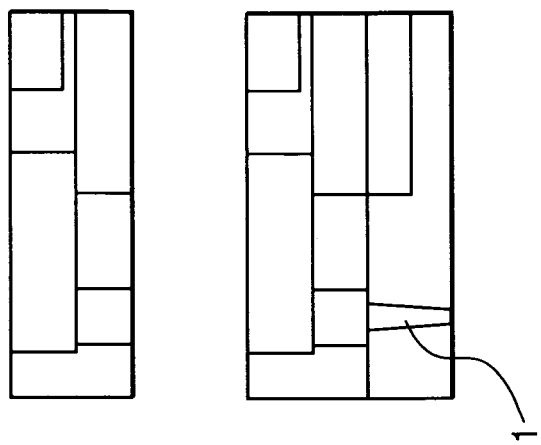
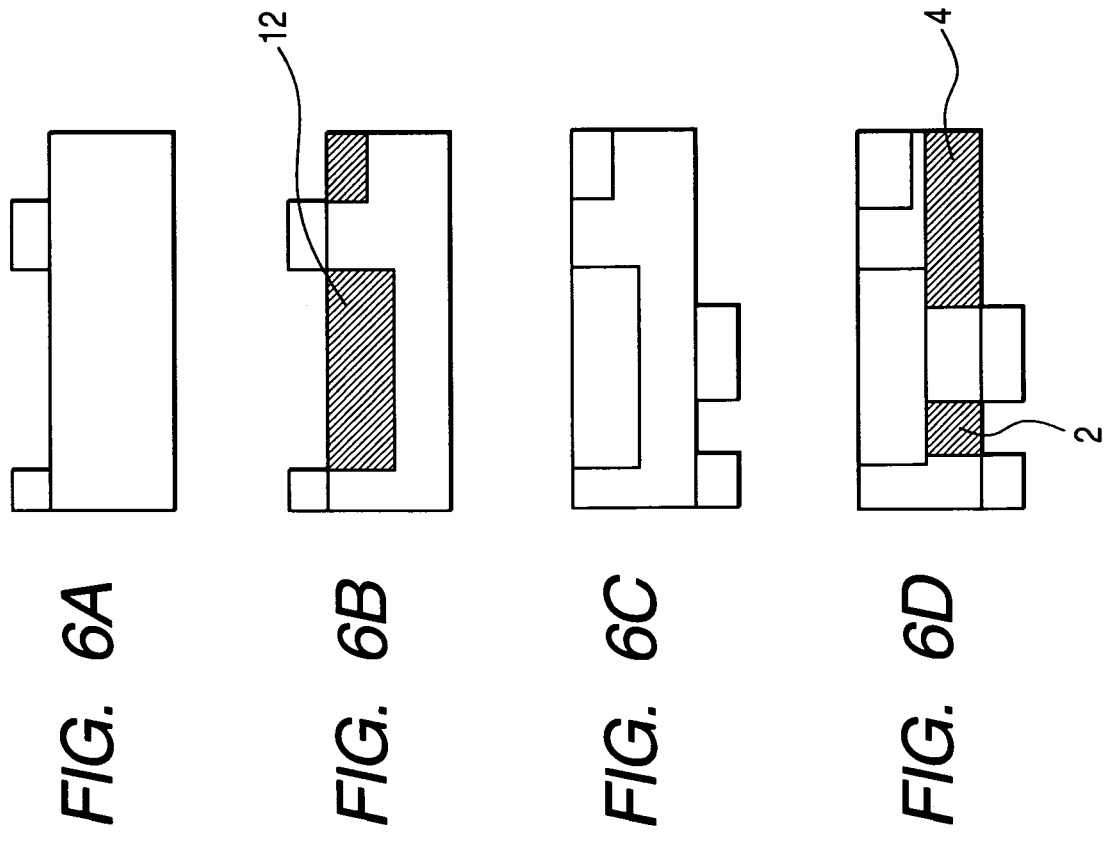

DIELECTRIC ELEMENT, PIEZOELECTRIC ELEMENT, INK JET HEAD AND METHOD FOR PRODUCING THE SAME HEAD

BACKGROUND OF THE INVENTION

1. Field of the Invention

The present invention relates to a dielectric element applicable to capacitors, sensors, transducers, actuators and the like, piezoelectric element (electrostrictive element) using the same dielectric element, ink jet head, and method for producing the same head. The dielectric element is also suitable in particular for a piezoelectric element for ferroelectric memories, MEMS elements, memory heads, optical shutters and speakers.

2. Related Background Art

Dielectric materials of high relative dielectric constant have been in demand for capacitors. At the same time, films of ceramic materials, e.g., $BaTiO_3$, have been becoming thinner to reduce their capacitor size. However, ceramic materials of $BaTiO_3$, Pb (Zr, Ti) $O_3$ or the like have a relative dielectric constant of 1500 or so at the highest. This, coupled with problems resulting from unsatisfactory sintering or defective structures in the interfaces, may damage characteristics of electronic devices in which the thin ceramic film is used. Nowadays, there is some movement to apply a PZT (111)-oriented film, which has a stable remanent polarization value, to memories. For example, Japanese Patent Application Laid-Open No. 2003-179278 discloses a method for producing a (111)-oriented film. This method first forms a YSZ (111)-oriented film as a buffer layer on a Si substrate, and then an $SrRuO_3$ (SRO) (111)-oriented film by utilizing the lattices of the buffer layer, to form a (111)-oriented film on the Si substrate. This method, however, involves several problems. It needs a buffer layer, and also needs control of stress in the buffer layer, because it determines performance of the element. Furthermore, when a film is stress-controlled to have a tensile stress prevailing therein, the SRO (111)-oriented film may not be produced with stable crystallinity. Moreover, all of these films are formed by epitaxial growth and hence frequently with poor reproducibility. Therefore, there are demands for methods which can solve the above problems for producing uniaxially oriented films having the same orientation with uniform characteristics, or epitaxial film structures with high reproducibility.

Recently, studies have been extensively made to apply piezoelectric elements to MEMSs and other purposes, and a thin film of a piezoelectric element with excellent characteristics has been expected. A piezoelectric element is composed of a piezoelectric layer placed between electrodes to expand or contract when a voltage is applied to the layer, and is applicable to various purposes, e.g., motors, ultrasonic motors and actuators.

The materials used in the above-described applicable areas are PZT-based ones, discovered about 50 years ago. They are sintered at 1100° C. or higher, and have been developed by various methods, e.g., sol-gel, sputtering, MBE, PLD and CVD, when applied to thin-film elements. One of the major problems tending to occur in many cases when they are formed into thin films is physical destruction within the film or in the film interfaces. Therefore, attempts have been made to devise crystal structure of the piezoelectric layer to secure a high piezoelectric constant and voltage resistance. Japanese Patent Application Laid-Open No. H8-116103 discloses a sputtering-produced (001)-oriented film for ink jet heads. This method provides an oriented electrode on a substrate to control crystal structure of the piezoelectric layer. This method can form a (001)-oriented Pt electrode of high crystallinity on a single-crystal MgO substrate. However, applicability of the device is frequently limited, because a single-crystal MgO substrate is expensive and limited in size. Moreover, a (111)-oriented piezoelectric film is formed on the (111) plane of deliquescent MgO, and there is still a room for improvement left in the method for more stably forming a (111)-oriented Pt crystal film.

SUMMARY OF THE INVENTION

The present invention is based on the method. developed to provide a dielectric layer of crystal structure preferentially or uniaxially oriented on a common substrate for solving the above problems.

The first aspect of the dielectric element of the present invention comprises a lower electrode layer, dielectric layer and upper electrode layer in this order on a substrate, wherein at least one of the lower and upper electrode layers comprises a first electrode layer mainly composed of a metal and second electrode layer mainly composed of an oxide, each of the first electrode layer, second electrode layer and dielectric layer has a preferentially or uniaxially oriented crystal structure, and the first electrode layer, second electrode layer and dielectric layer satisfy the relationship represented by the general formula (1):

$$f3 > f2 > f1 \geq 0.1° \quad (1)$$

where, f1, f2 and f3 are half bandwidths of the X-ray diffraction (XRD) peaks of the first electrode layer, second electrode layer and dielectric layer in the preferentially or uniaxially orientation axis, the breadth being determined by fitting a pseudo-Voigt function, and f1 is in a range from 0.1 to 10°.

In the first aspect, the metal in the first electrode layer is preferably a face-centered cubic crystal system and (111)-oriented. It is also preferable that the second electrode layer is mainly composed of a perovskite oxide which is preferentially or uniaxially oriented in the (111) direction and has a half bandwidth f2 of the XRD peak in a range from 0.5 to 3.0°, determined by fitting a pseudo-Voigt function, in the (101) direction, which is not perpendicular to the second electrode layer surface. It is also preferable that the dielectric layer has a perovskite structure which is preferentially or uniaxially oriented in the (111) direction and has a half bandwidth f3 of the XRD peak in a range from 1.0 to 6.0°, determined by fitting a pseudo-Voigt function, in the (101) direction, which is not perpendicular to the dielectric layer surface.

The second aspect of the dielectric element of the present invention is a dielectric element comprising an intermediate layer, lower electrode layer, dielectric layer and upper electrode layer in this order on a substrate, wherein the lower electrode layer comprises a first and second electrode layers, the former being mainly composed of a face-centered cubic crystal metal which is (111)-oriented and having a half bandwidth of the XRD (111) peak in a range from 0.1 to 10°, determined by fitting a pseudo-Voigt function, and the latter being positioned adjacent to the first electrode, mainly composed of a perovskite oxide which is oriented in the (111) direction and having a half bandwidth of the XRD (101) peak in a range from 0.5 to 11°, determined by fitting a pseudo-Voigt function, and the dielectric layer has a perovskite structure which is oriented in the (111) direction and has a half bandwidth of the XRD (101) peak in a range from 1.0 to 12°, determined by fitting a pseudo-Voigt function.

In the second aspect, it is preferable that the substrate is made of silicon, and a $SiO_2$ layer is formed to a thickness of 5 nm or more as the intermediate layer on the substrate.

Moreover, in the first and second aspects, the dielectric layer preferably has a crystal orientation degree of 80% or more, more preferably 99% or more in the (111) direction.

Moreover, the dielectric element of the present invention comprises a lower electrode layer, dielectric layer and upper electrode layer in this order on a substrate, wherein at least one of the lower and upper electrode layers comprises a first electrode layer mainly composed of a metal and second electrode layer mainly composed of an oxide, each of the first electrode layer, second electrode layer and dielectric layer has a preferentially or uniaxially oriented crystal structure, and the first electrode layer, second electrode layer and dielectric layer each are a single-crystal layer, and satisfy the relationship represented by the general formula (1):

$$f3>f2>f1 \geq 0.1° \quad (1)$$

where, f1, f2 and f3 are half bandwidths of the XRD peaks of the first electrode layer, second electrode layer and dielectric layer in the preferentially or uniaxially orientation axis, the breadth being determined by fitting a pseudo-Voigt function, and f1 is in a range from 0.1 to 3°, inclusive.

Still more, the dielectric element of the present invention comprises a (100)-oriented single-crystal film containing $Y_2O_3$ at 1 to 20% by weight, inclusive, the balance being $ZrO_2$, a (111)-oriented single-crystal film of face-centered cubic crystal metal, a (111)-oriented single-crystal film of perovskite oxide, and a (111)-oriented single-crystal film of perovskite oxide as a dielectric layer in this order on a (100)-oriented silicon substrate.

Each dielectric element of the above structure is applicable to piezoelectric elements.

The ink jet head of the present invention comprises a liquid passage in communication with a discharge port from which a liquid is discharged and piezoelectric element which gives energy to the liquid in the liquid passage for discharging it from the discharge port, wherein the dielectric element of the above structure is used as the piezoelectric element. The ink jet head can be used for ink jet recording units.

The method of the present invention for producing a dielectric element is for producing the dielectric element of the above structure, wherein the substrate temperature levels are preferably set to satisfy the relationship represented by the general formula (2):

$$T2 \geq T3 > T1 \quad (2)$$

where,

T1: substrate temperature at which the first electrode layer is formed

T2: substrate temperature at which the second electrode layer is formed

T3: substrate temperature at which the dielectric layer is formed.

The method of the present invention can produce a dielectric element of layered structure with a face-centered cubic crystal metal film coated with an oxide electrode layer and dielectric layer, wherein the half bandwidths of the peaks of these layers, determined by a reciprocal lattice map, satisfy a specific relationship, even when these layers are formed on a substrate of a common material.

Moreover, the method of the present invention can reproducibly give a dielectric element of limited variations of characteristics, because it can form the dielectric layer for the element at a reduced temperature to relax stress therein with little selectivity to substrate. The dielectric element is suitable as a piezoelectric element for ink jet heads; as a dielectric element for capacitors, sensors, transducers, actuators; and as a piezoelectric element for ferroelectric memories, MEMS elements, memory heads, optical shutters and speakers.

BRIEF DESCRIPTION OF THE DRAWINGS

FIGS. 6A, 6B, 6C, 6D, 6E and 6F are schematic views for showing a process for producing a second substrate for an ink jet head;

DESCRIPTION OF THE PREFERRED EMBODIMENTS

Figure 1:
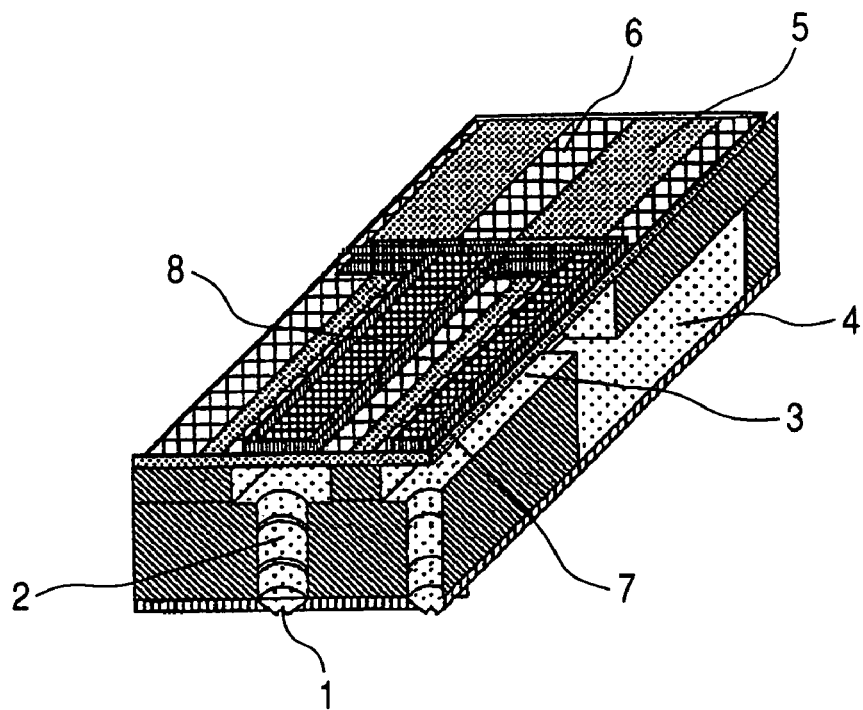
FIG. 1 is a schematic view of an ink jet head.

First, the first aspect of the dielectric element of the present invention is described. The dielectric element has a structure with a lower electrode layer, dielectric layer and upper electrode layer in this order on a substrate. At least one of the lower and upper electrode layers comprises a first electrode layer mainly composed of a metal and second electrode layer mainly composed of an oxide. Each of the first electrode layer, second electrode layer and dielectric layer independently has a preferentially or uniaxially oriented crystal structure. The first electrode layer, second electrode layer and dielectric layer satisfy the relationship represented by the general formula (1):

$$f3>f2>f1 \geq 0.1° \quad (1)$$

where, f1, f2 and f3 are half bandwidths of the XRD peaks in a reciprocal lattice map of the first electrode layer, second electrode layer and dielectric layer in the preferentially or uniaxially orientation axis, the breadth being determined by fitting a pseudo-Voigt function, and f1 is in a range from 0.1 to 10°.

The dielectric element of the present invention, formed to have the above structure, has no selectivity to substrate while exhibiting stable characteristics. The crystalline dielectric layer can be formed at a reduced temperature, which is another advantage of the structure. Moreover, the present invention can provide a material which is substantially free of cracking, exfoliation and the like while being formed into devices, because substrate removal and patterning of the dielectric layer change internal stresses to only a limited extent.

The first electrode layer is mainly composed of a face-centered cubic crystal metal which is (111)-oriented and has a half bandwidth f1 of the XRD (111) peak in a range from 0.1 to 10°, determined by fitting a pseudo-Voigt function.

The second electrode layer is mainly composed of a perovskite oxide which is preferentially or uniaxially oriented in the (111) direction and preferably has a half bandwidth f2 of the XRD peak in a range from 0.5 to 11°, determined by fitting a pseudo-Voigt function, in the (101) direction, which is not perpendicular to the second electrode layer surface.

The material for the first electrode layer is not limited, so long as it is a metal which can be a face-centered cubic crystal. The useful metals include Ni, Pt, Pb, Ir, Cu, Al, Ag and γ-Fe, of which Ni, Pt and Ir are more preferable. A face-centered metal is (111)-oriented in a naturally oriented film, and can be easily (111)-oriented under widely varying film-making conditions irrespective of the lower structure or electrode composition, which is the reason why a face-centered metal is preferable for the present invention. The film should have a half bandwidth of 0.1 or more, determined by fitting a pseudo-Voigt function.

It is found that the second electrode can be formed on the first electrode having a specific half bandwidth for forming the (111)-oriented dielectric layer (dielectric film) with good characteristics, resulting in the present invention.

The dielectric element with the first electrode layer having a half bandwidth of the (111) peak of below 0.1°, determined by a reciprocal lattice map, is unsuitable for devices, because the electrode layer strongly restricts the substrate and generates high stresses in the layer, although high in crystallinity. On the other hand, the first electrode layer having a half bandwidth above 10° may make the dielectric element insufficient in dielectric or piezoelectric characteristics, because of difficulty in controlling crystallinity of the second electrode on the first electrode, which possibly leads to random crystallinity of the dielectric layer.

The second electrode layer is preferentially or uniaxially oriented in the (111) direction and preferably has a half bandwidth f2 of the XRD peak in a range from 0.5 to 11°, inclusive, determined by fitting a pseudo-Voigt function for the peak in a reciprocal lattice map.

The dielectric layer on the second electrode layer preferably has a perovskite structure, is preferentially or uniaxially oriented in the (111) direction and has a half bandwidth f3 of the (101) peak in a reciprocal lattice map in a range from 1.0 to 12°, determined by fitting a pseudo-Voigt function. For the dielectric layer, the half bandwidth of the (101) peak is specified, because its (101) peak appears close to the (111) peak of the metal. Consequently, use of a peak other than the (111) peak should give a more accurate half bandwidth and hence more preferable. In this case, the (101) peak appearing at around $\psi=35°$ is measured. It is preferable to select a peak overlapping another to a lesser extent, as required, to judge a more accurate peak, although its position varies with a material used. Each layer having a half bandwidth of the peak in the above range can reduce production-related troubles and give a dielectric element with good characteristics. A discontinuous layer or very thin layer may be placed between the above layers so long as the functions of the objective dielectric element are kept.

In production of the above dielectric element, the substrate is provided with the electrode layer A comprising the first and second electrodes, then with the dielectric layer and electrode layer B to have a desired structure. When a substrate for production is directly used as the dielectric layer, the electrode layer A works as the lower electrode on the substrate side and electrode B works as the upper electrode. When a substrate is provided on the electrode B side after a substrate for production is removed, the electrode B works as the lower electrode on the element substrate side and electrode A works as the upper electrode.

Next, the second aspect of the dielectric element of the present invention is described. The dielectric element of the second aspect comprises an anchor layer as an intermediate layer, lower electrode layer comprises a first and second electrode layers, the former being mainly composed of a face-centered cubic crystal metal which is (111)-oriented and having a half bandwidth of the XRD (111) peak in a range from 0.1 to 10°, determined by fitting a pseudo-Voigt function, and the latter being positioned adjacent to the first electrode, mainly composed of a metal oxide which is oriented in the (111) direction and having a half bandwidth of the XRD (101) peak in a range from 0.5 to 11°, determined by fitting a pseudo-Voigt function, and the dielectric layer having a perovskite structure which is oriented in the (111) direction and having a half bandwidth of the XRD (101) peak in a range from 1.0 to 12°, determined by fitting a pseudo-Voigt function.

The preferable half bandwidths are 0.3 to 3° for the first electrode layer, 1.0 to 5° for the second electrode layer and 2.0 to 6° for the dielectric layer (piezoelectric layer). They preferably satisfy the relationship f3>f2>f1, where, f1, f2 and f3 are half bandwidths of the first electrode layer, second electrode layer and dielectric layer. It is preferable that the first and second electrodes are substantially adjacent to each other, although a thin, dissimilar film may be placed between them so long as the functions of the objective dielectric element are kept. The same holds for the relationship between the second electrode layer and dielectric layer.

The substrate for the dielectric element for the second aspect can stably give the element of the present invention, when coated with a $SiO_2$ layer as an oxide layer having a thickness of 5 nm or more, without altering the production process.

The dielectric layer in the first and second aspects preferably have a crystal orientation degree of 80% or more in the (111) direction. This can secure the good dielectric and piezoelectric characteristics. More preferably, the (111)-oriented dielectric layer has a degree of 90% or more, still more preferably 99% or more.

The third aspect of the present invention is a structure related to a (111)-oriented, single-crystal dielectric element, comprising a lower electrode layer, dielectric layer and upper electrode layer in this order on a substrate, wherein at least one of the lower and upper electrode layers comprises a first electrode layer mainly composed of a metal and second electrode layer mainly composed of an oxide, each of the first electrode layer, second electrode layer and dielectric layer is a single-crystal layer, and the first electrode layer, second electrode layer and dielectric layer satisfy the relationship represented by the general formula (1):

$$f3 > f2 > f1 \geqq 0.1° \quad (1)$$

where, f1, f2 and f3 are half bandwidths of the XRD peaks of the first electrode layer, second electrode layer and dielectric layer, the breadth being determined by fitting a pseudo-Voigt function, and f1 is in a range from 0.1 to 3°, inclusive.

Moreover, the dielectric element comprises a (100)-oriented single-crystal film containing $Y_2O_3$ at 1 to 20% by weight, inclusive, the balance being $ZrO_2$, (111)-oriented single-crystal film of face-centered cubic crystal metal, (111)-oriented single-crystal film of perovskite oxide, and (111)-oriented single-crystal film of perovskite oxide as the dielectric layer in this order on a (100)-oriented silicon substrate.

The above structure can give the (111)-oriented, single-crystal dielectric element well reproducibly while solving the above problems.

One of the preferable layer structures comprises (111)-oriented PZT/(111)-oriented SRO/(111)-oriented Pt/(100)-oriented YSZ/(100)-oriented Si.

Degree of crystal orientation is estimated by ratio of peak intensity in the major orientation to total peak intensities in all directions from θ–θ in XRD measurement. In a single-crystal dielectric system, intensity is observed only for a peak oriented in one direction, and in-plane orientation is well aligned, as indicated in a pole figure.

The electrode layer of perovskite oxide, when directly formed on (100)-oriented YSZ tends to be (110)-oriented rather than (111)-oriented, and so is on SRO. It is therefore necessary to form the layer via a face-centered cubic metal layer, as described above.

The dielectric element of the above structure works as a piezoelectric layer, when the dielectric layer is piezoelectric.

Next, the material for each layer of the dielectric element is described.

The material for the first electrode layer is described above. The material for the second electrode layer can be selected from electroconductive, perovskite oxides. These oxide compounds include $La_{1-x}Sr_xVO_3$ with $0.23 < x \leqq 1$, $Gd_{1-x}Sr_xVO_3$ with $0.4 < x < 0.5$, $La_{1-x}Sr_xCoO_3$ with $0 < x < 1$, $Ca_{1-x}Sr_xRuO_3$ with $0 < x < 1$, $(Ba, Ca, Sr)TiO_{3-x}$ with $x \neq 0$, $SrRuO_3$, $CaRuO_3$, $BaPbO_3$, $La_2SrCu_2VO_{6.2}$, $SrCrO_3$, $LaNiO_3$, $LaCuO_3$, $BaRuO_3$, $SrMoO_3$, $CaMoO_3$, $BaMoO_3$, and $SrIrO_3$, of which $SrRuO_3$, $LaNiO_3$, $BaPbO_3$, and $CaRuO_3$ are more preferable. The preferable perovskite oxides for the dielectric or piezoelectric layer include those represented by $Pb(Zr_xTi_{1-x})O_3$ preferably with $0.2 < x < 0.8$, which may be doped with La, Nb, Si, Ca or Sr. Those useful materials other than PZT-based ones include $BaTiO_3$—$SrTiO_3$— and $BaTiO_3$-$BaZrO_3$-based ones. In particular, the dielectric or piezoelectric layer is ferroelectric, when it has the (111) plane running in parallel to the substrate surface.

A (111)-oriented PZT layer, when formed on a (111)-oriented, face-centered cubic metal layer on a YSZ layer, may have destroyed crystallinity. This problem can be solved by forming the layer via a (111)-oriented perovskite oxide layer, as in the third aspect. Each electrode layer preferably has a thickness in the range, described later, for the electrode layer to keep single-crystallinity. Moreover, the YSZ layer is incorporated with $Y_2O_3$ at 1 to 20% by weight for single-crystallinity. Moreover, the YSZ layer composition is preferably not inclined, and compositionally fluctuates within ±5%.

The piezoelectric element of the dielectric element having the above structure can be used for producing an ink jet head. The ink jet head is durable and stably works, when it uses the piezoelectric element of the above structure. One example of the ink jet head structure is described by referring to FIGS. 1 and 2. FIG. 1 schematically illustrates an ink jet head comprising the discharge port 1 through which a liquid, e.g., ink, is discharged, liquid passage 2 by which the individual liquid chamber 3 is in communication with the discharge port 1, common liquid chamber 4, vibrator 5, lower electrode 6, piezoelectric layer 7 and upper electrode 8. The piezoelectric layer 7 has a rectangular surface in the vibrator 5 plane direction, as illustrated in FIG. 1. However, it may have an ellipsoidal, circular or parallelogram surface. The piezoelectric layer 7 is described in more detail by referring to FIG. 2, which is a cross-sectional view of the layer shown in FIG. 1, cut in the width direction, perpendicular to the vibrator 5, where 9: second electrode layer, 7: piezoelectric layer, 5: vibrator, 6: first electrode layer, 8: upper electrode, 12: individual liquid chamber, and 11: partition in the liquid chamber. In this specific example, the second electrode layer is patterned like the piezoelectric layer, but may be designed similarly to the first electrode layer 6. A preferred embodiment has an anchor layer between the first electrode layer 6 and vibrator 5 (or substrate). The preferable materials for the anchor layer include metals, e.g., Ti, Cr, Pb and Ni; and oxides, e.g., $TiO_2$. The film thickness of the anchor layer is 0.5 to 50 nm, preferably 1 to 20 nm. The material constituting the anchor layer may be laminate of the above materials. Moreover, the upper electrode may be multi-layered with a first and second electrodes. In this specific example, the layer comprising the layers 7 and 9 has a rectangular cross-section, but may have a trapezoidal or inverted trapezoidal cross-section. Moreover, the order of the layer 8 and electrode layer comprising the layers 6 and 9 may be inverted. In other words, the structure may comprise, the first electrode layer 6, the second electrode layer 9, and the piezoelectric layer 7 in this order. The inverted structure, caused from a device production process, can secure the same effect.

The first and second electrode layers 6 and 9 or first electrode layer 6 for the lower electrode extends beyond the piezoelectric layer 7, and the upper electrode extends beyond the element on the side opposite to the lower electrode, to be connected to a driving power source (these situations are not shown).

The vibrator can be made of a material which has a Young's modulus of 50 GPa or more, preferably 60 GPa or more, and hence can be formed into a plate shape. The materials useful for the vibrator 5 include $SiO_2$, SiN, SiNO, $ZrO_2$ (which may be doped with a stabilizing element), Si (which may contain a dopant.), stainless steel, Ti, Cr, Ni and Al. The vibrator 5 may be 0.5 to 10 μm thick, preferably 1.0 to 6.0 μm. The electrode layer may be 0.05 to 0.6 μm thick, preferably 0.08 to 0.3 μm thick. For the electrode layer comprising at least 2 layers of first and second electrode layers, the first layer may be 5 to 450 nm thick, preferably 10 to 200 nm thick, and the second electrode layer may be 5 to 250 nm thick, preferably 10 to 150 nm thick. The individual liquid chamber 12 may have a width Wa (see FIG. 5) of 30 to 180 μm, and length Wb (also see FIG. 5) of 0.3 to 6.0 mm, although varying depending on quantity of liquid droplets to be discharged. The discharge port 1 preferably has a circular or star-shaped cross-section of 7 to 30 µm in diameter in the plane perpendicular to the opening direction, and a cross-section flaring towards the liquid passage 2 along the opening direction. The liquid passage 2 is preferably 0.05 to 0.5 mm long. The liquid droplet discharge speed may be insufficient when a longer passage is used, and fluctuate largely when a shorter one is used.

The ink jet head of the above structure can be used for ink jet recording units.

The piezoelectric element of the above structure can give an ink jet head with stable discharge characteristics and long service life, and ink jet recording units with high performance.

Figure 8:
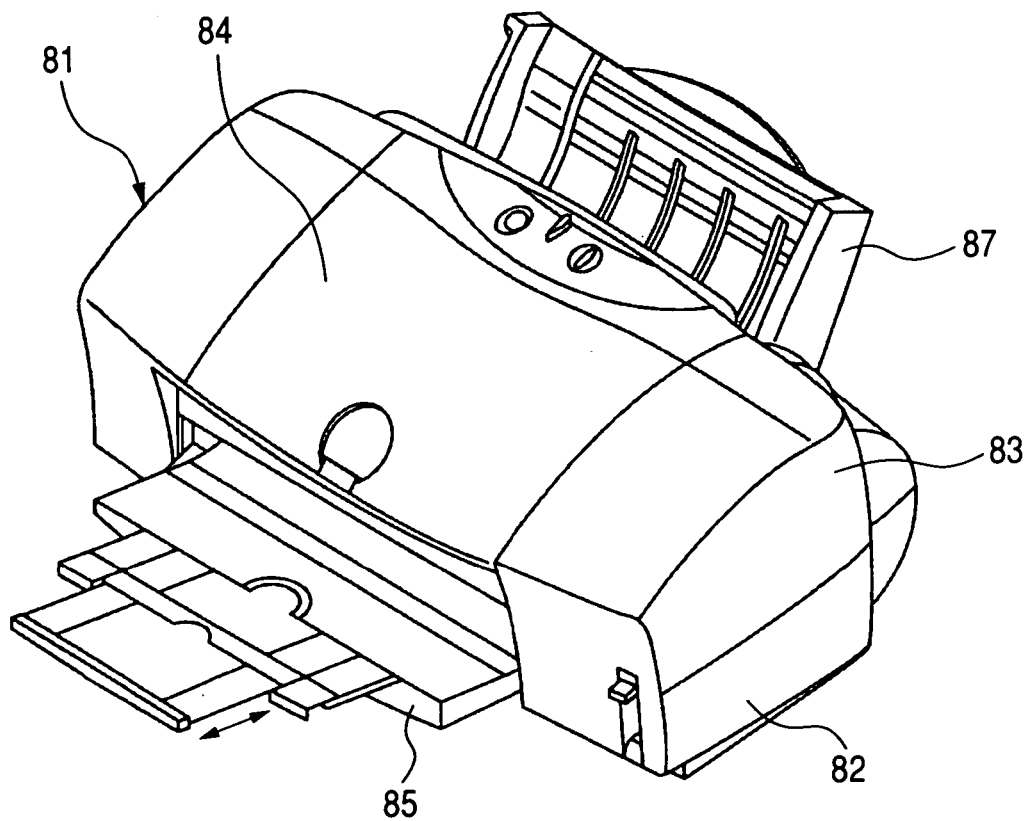
FIG. 8 outlines an ink jet recording unit.
Figure 9:
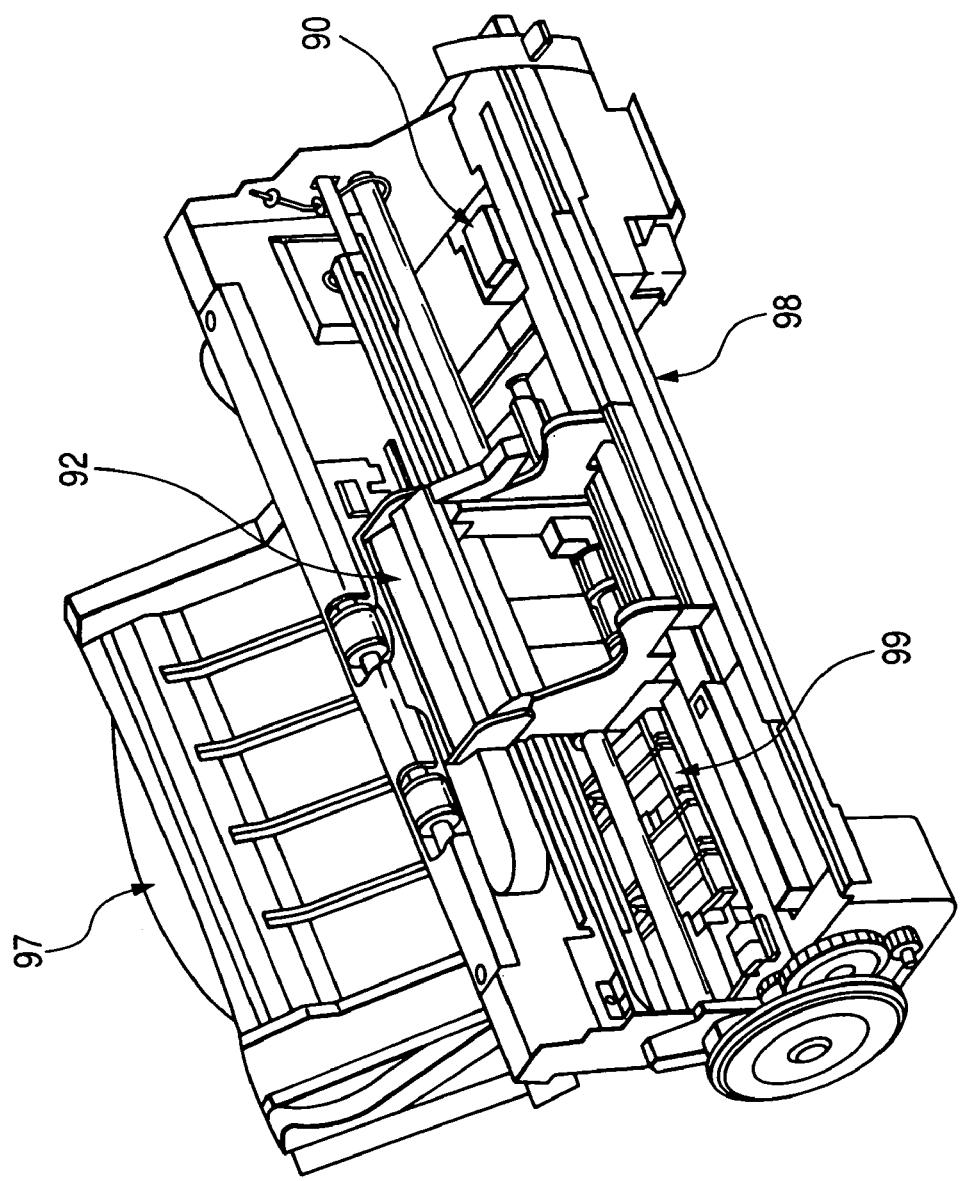
FIG. 9 is a schematic view of an ink jet recording unit, with the exteriors removed.

FIG. 8 outlines an ink jet recording unit which uses the ink jet head of the present invention, and FIG. 9 outlines the ink jet recording unit, with the exteriors 81 to 85 and 87 removed to illustrate the working mechanism. The unit comprises the automatic feeder 97 which automatically supplies recording paper as a recording medium into the unit inside, transfer section 99 which sends the recording paper supplied by the automatic feeder 97 to a given recording position and sends the paper from the recording position to the medium discharge port 98, recording member which performs recording on the paper at the recording position, and recovering member 90 which is responsible for recovering treatment for the recording member. The ink jet head of the present invention is set in the carriage 92 in the unit. FIG. 8 shows a printer as one of the devices to which the ink jet head of the present invention is applicable. However, the ink jet head of the present invention is also applicable to facsimiles, complex machines, copiers and industrial discharging units.

Next, the method for producing the dielectric element of the above structure is described. First, a substrate for production is coated with the first electrode layer, second electrode layer and dielectric layer in this order. It is recommended that the second electrode layer and dielectric layer are formed while the substrate is being heated. The dielectric layer is preferably (111)-oriented for production-related considerations, e.g., productivity.

FIGS. 3A to 3D outline a specific process for producing the dielectric element of the present invention. The process comprises at least a step for forming the first electrode layer 22 on the substrate 21, step for forming the second electrode layer 23 and step for forming the dielectric layer 24. The dielectric element also has the upper electrode layer 26. The substrate 21 is made of a material selected from Si, stainless steel and others. The substrate material is selected so as to have heat resistance up to 600° C., irrespective of crystallinity and crystal orientation, which is one of the characteristics of the method of the present invention. However, Si(110), Si(100), or stainless steel is preferably selected for the device formation in the latter half process. Selection of an Invor material with low thermal expansion coefficient is a preferred aspect for a stainless steel substrate. The Si substrate, whether or not it is coated with an oxide layer, can give the element of similar structure, because the present invention is not dependent on crystal structure for the substrate. This brings a production-related merit, because it can dispense with a substrate etching step for removing an oxide layer.

The electrode and dielectric layer layers can be produced by various methods, e.g., sputtering, MO-CVD, laser-aided abrasion, sol-gel and MBE, of which sputtering, MO-CVD and sol-gel are more preferable, and sputtering and MO-CVD are still more preferable.

The substrate 21 is coated with the first electrode layer preferably while it is not heated, or heated at a moderate temperature. This prevents a high stress from being generated in the first electrode layer. The face-centered cubic metal, described earlier, for the first electrode layer should be selected from those resistant to heat under the heating conditions in the subsequent steps. It is preferably selected from face-centered cubic metals having a half bandwidth of 0.1 to 10°.

In the method of the present invention for forming a dielectric element, the substrate temperature levels are preferably set to satisfy the relationship $T2 \geq T3 > T1$, where T1: substrate temperature at which the first electrode layer is formed, T2: substrate temperature at which the second electrode layer is formed and T3: substrate temperature at which the dielectric layer is formed. More specifically, T1 is preferably room temperature to 350° C., inclusive, more preferably 100 to 350° C., inclusive; T2 is 300 to 800° C., inclusive; and T3 is preferably 450° C. or higher but below 600° C. When $T3 \leq T2$, the dielectric layer can be formed without any problem, e.g., compositional deviation resulting from release of oxygen from the second electrode layer as the oxide electrode, to give the dielectric element to be assembled in a device while keeping its inherent characteristics.

The second electrode is preferably produced by forming the above-described perovskite oxide into a film under heating while keeping the substrate at an adequate temperature level. The substrate heating temperature is 300 to 800° C., preferably 450 to 620° C. The perovskite oxide can be formed into the oxide electrode layer having a half bandwidth of 0.5 to 11° under the above conditions. The dielectric element of the present invention can be produced by forming the dielectric layer on the second electrode layer while keeping the substrate on which it is formed while heating the substrate. The thin (111)-oriented crystalline film of perovskite structure can be formed as the dielectric film at a lower temperature by forming the dielectric layer on the second electrode layer. The temperature level at which the substrate is to be kept is already described earlier. The dielectric layer is preferably formed at around 500° C., and it is recommended that the substrate is kept at 450 to 550° C. Moreover, the dielectric layer can have a half bandwidth of 1.0 to 12° by controlling the operating conditions, e.g., gas pressure. When an MO-CVD process is adopted, the pulsed process in which the starting gas is supplied onto a substrate intermittently rather than continuously is preferable. This is another condition for the process, in addition to substrate temperature.

The method for producing the dielectric element as the third aspect comprises a step for forming a (100)-oriented YSZ film on a (100)-oriented Si substrate, step for forming a face-centered cubic metal film, step for forming an electrode layer of perovskite oxide, step for forming a (111)-oriented dielectric element, and step for forming another electrode on the dielectric element.

The YSZ film, when formed on a Si substrate heated at around 800° C., can be epitaxially grown while fitting lattice constants of the substrate. It is preferably formed by sputtering. It is particularly preferable to form the film on a substrate coated with a $SiO_2$ layer having a thickness of 15 nm or less. The $SiO_2$ layer should be sufficiently thin, having a thickness in the above range, to be depleted by the reaction with metallic Zr deposited thereon. The YSZ film is then coated with a (111)-oriented, face-centered cubic metal film.

A single-crystal electrode layer of perovskite oxide can be also (111)-oriented, when formed on the metal film.

The (111)-oriented dielectric layer is formed by the method described earlier.

The method for producing the dielectric layer is applicable to production of ink jet head in which the dielectric element is used as a piezoelectric element. The method for producing an ink jet head may fall into the following two general categories.

The first method at least comprises a step for forming a first electrode layer on a substrate while it is not heated or heated, step for forming, under heating, a second electrode layer which is oriented, electroconductive and mainly composed of a metal oxide, step for forming a (111)-oriented dielectric layer, step for forming an upper electrode layer, step for forming individual liquid chambers and step for forming liquid discharge ports.

The second method at least comprises a step for forming a first electrode layer on a substrate while it is not heated, step for forming, under heating, a second electrode layer which is oriented, electroconductive and mainly composed of a metal oxide, step for forming a (111)-oriented dielectric layer, step for joining the (111)-oriented dielectric layer to an electrode layer formed on a second substrate, step for removing the first substrate, step for forming individual liquid chambers and step for forming liquid discharge ports. The (111)-oriented dielectric layer may be joined to the second substrate after it is provided with a vibrator.

Figure 4:
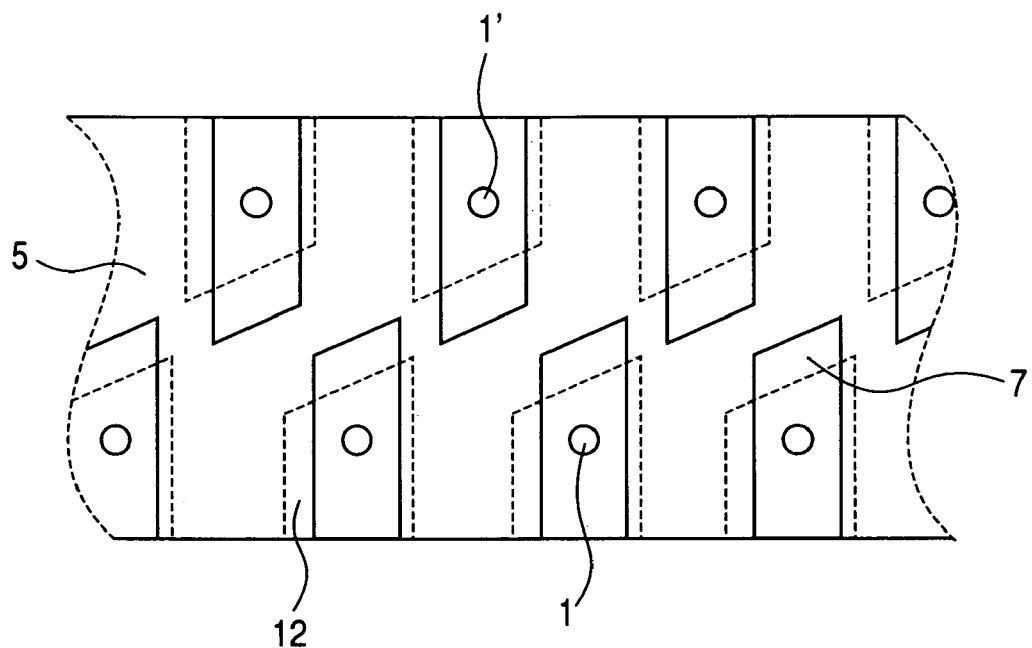
FIG. 4 is a plan view of an ink jet head.
Figure 5:
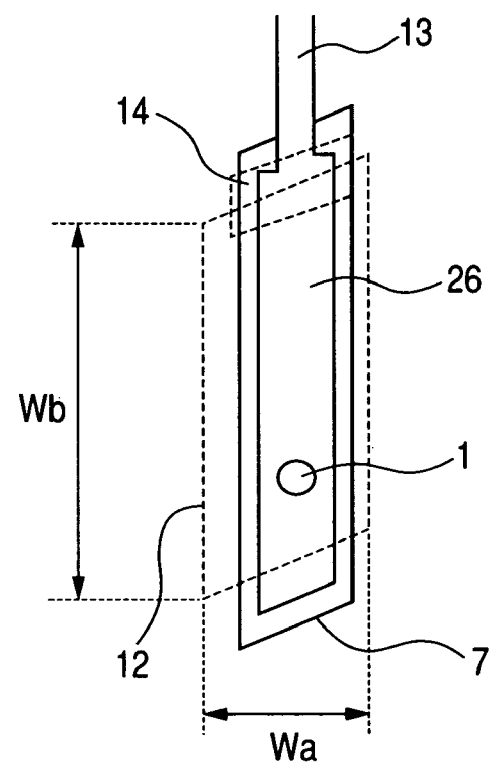
FIG. 5 is a plan view of individual liquid chambers in an ink jet head.

The first method is the same as the method for producing the dielectric element until the piezoelectric layer is formed, and additionally comprises a step for removing part of the substrate 21 and step for forming the ink discharge ports. The substrate is partly removed to form the individual liquid chambers 3 in FIGS. 1 or 12 in FIG. 2. A plurality of chambers can be formed by treating the substrate by wet etching, dry etching, sand milling or the like, at certain pitches on the substrate. Arranging these chambers 12 in zigzags is a preferred embodiment, as shown in FIG. 4, which is a plan view of an ink jet head. Referring to FIG. 4, the region 12 defined by broken lines represents that for the individual liquid chamber to which a pressure is applied, and the region 7 represents that for the patterned piezoelectric element. The piezoelectric layer in the piezoelectric element is composed at least of the dielectric element of the present invention and upper electrode. In FIG. 4, the region 5 represents portion for the vibrator and lower electrode. Unlike the vibrator, the lower electrode may be patterned, as shown in FIGS. 3A to 3D. At least the electrode immediately below the dielectric layer has a layered structure with the first and second electrode layers. In FIG. 4, the region for the individual liquid chamber is formed of a parallelogram. It is a representative shape, when formed by wet etching of a (110)-oriented Si substrate with an alkali in the case where substrate selectivity can be disregarded, as in production of the dielectric element of the first or second aspect, and so is shown in FIG. 4. In addition, it may be rectangular. When it is formed of a parallelogram, as illustrated in FIG. 5, the piezoelectric is preferably patterned in the shape of parallelogram to minimize distance between the discharge ports 1 and 1'. FIG. 5 is a plan view showing the whole individual liquid chamber, where the upper electrode 26 is connected to a driving circuit by the region 13 extending from the individual liquid chamber 12, and the region 14 represents a restriction in the passage extending from the common liquid chamber to the individual liquid chamber. In this specific example shown in FIG. 5, the piezoelectric layer extends into this region, which, however, is not prerequisite.

The ink discharge port 1 is formed in such a way to connect the substrate on which it is formed, or the discharge port 1 and liquid passage 2 are formed, to another. It can be formed by etching, machining or laser beams. The substrate on which the liquid discharge port is formed may be the same as, or different from, the substrate on which the piezoelectric layer is formed. When these substrates are different from each other, the former substrate is made of a material, e.g., stainless steel or Ni, selected from those having a thermal expansion coefficient different by 1E-6 to 1E-8° C. from that of a material for the latter substrate.

The substrates may be joined to each other by an organic adhesive agent, but more preferably by a metal, because it can join them at low 300° C. or lower, decreases a differential thermal expansion coefficient with the substrate to avoid problems, e.g., substrate deformation, when length of the dielectric element exceeds a certain level, and decreases damages on the piezoelectric layer. The metals useful for joining the substrates include. In, Au, Cu, Ni, Pb, Ti, Cr and Pd.

Next, the second method is described. It transfers the piezoelectric layer (dielectric layer) formed on the first substrate to the second substrate. It is the same as the method for producing the dielectric element, illustrated in FIGS. 3A to 3D, until the piezoelectric layer is formed. It additionally comprises a step for forming the vibrator 5 on the upper electrode while the piezoelectric layer is kept unpatterned and step for transferring the vibrator to the second electrode, or a step for forming the electrode and/or vibrator on the piezoelectric layer and step for joining the vibrator to the second substrate to transfer the vibrator to the second substrate together with the piezoelectric layer. The second substrate is provided with the individual liquid chamber 12, liquid passage 2 and common liquid chamber 4 by, e.g., the steps shown in FIGS. 6A to 6E (the figure shows the steps of 6A to 6F). The step shown in FIG. 6A forms a mask on the substrate for each of the individual liquid chambers. The step shown in FIG. 6B treats the substrate from the top by etching or the like (the cross-hatched region represents the area to be treated). The step shown in FIG. 6C removes the mask and forms a mask for the liquid passage 2. The step shown in FIG. 6D forms the liquid passage and common liquid chamber by treating the cross-hatched region on the substrate by etching or the like. FIG. 6E schematically illustrates the substrate provided with the individual liquid chamber, liquid passage and common liquid chamber after the mask is removed. FIG. 6F shows the substrate joined to the other substrate with the discharge port and part of the common liquid chamber. The substrate surface 16 with the liquid discharge port is preferably treated for liquid repellency.

Figure 7:
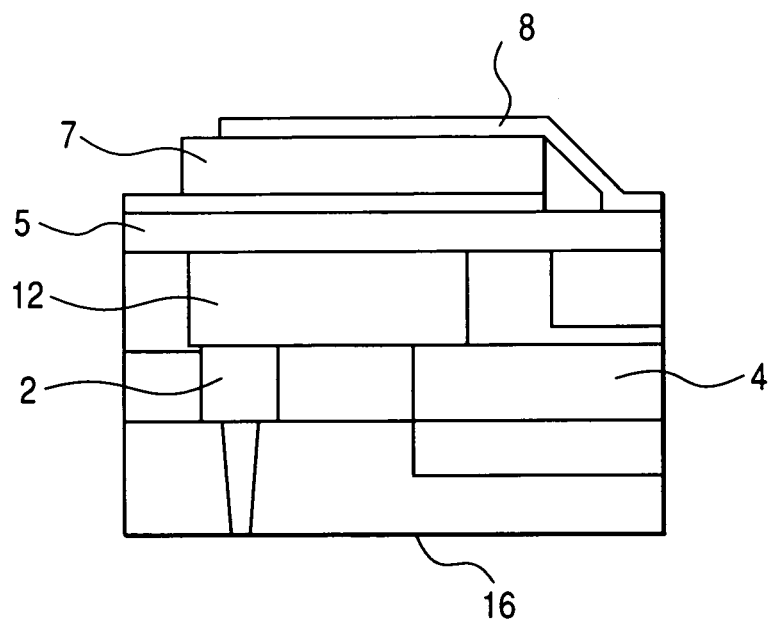
FIG. 7 is a cross-sectional view of an ink jet head in the longitudinal direction.

The second substrate to be joined to the piezoelectric layer on the first substrate is used in the condition illustrated in FIGS. 6E or 6F. When the piezoelectric layer is not provided with the vibrator, the second substrate having the vibrator on the individual liquid chamber 12 is used (FIGS. 6E or 6F). FIG. 7 illustrates the patterned piezoelectric layer, after the first substrate is joined and then removed. The upper electrode 8 shown in FIG. 7 is composed of the second and first electrodes in this order from the vibrator 5 side.

When the second substrate is formed with the vibrator to which the piezoelectric layer is transferred and then the first substrate is removed (described as the alternative to the second method), the piezoelectric may be patterned beforehand or not. When this process is adopted, it is preferable to use the metal joint layer as the lower electrode.

The method of the present invention for producing an ink jet head involves patterning of the piezoelectric layer and/or removal of the first substrate in the production process, which is one of the characteristics of the present invention. In this process, the first electrode layer of a metal can be used as an etching stop layer, which is a preferred embodiment viewed from the process side. Keeping a half bandwidth in the above range minimizes stress changes by the piezoelectric patterning step or substrate removal step, to bring advantages of reducing problems, e.g., cracking, exfoliation or deformation. This means that the present invention can produce the dielectric element on a substrate of large area, reduce the device unit cost and improve production through-put. The similar effects can be realized in the piezoelectric patterning step, to bring a significant advantage of reducing element characteristic changes, which may be caused by production steps.

The present invention is described by EXAMPLES.

EXAMPLE 1

Figure 11:
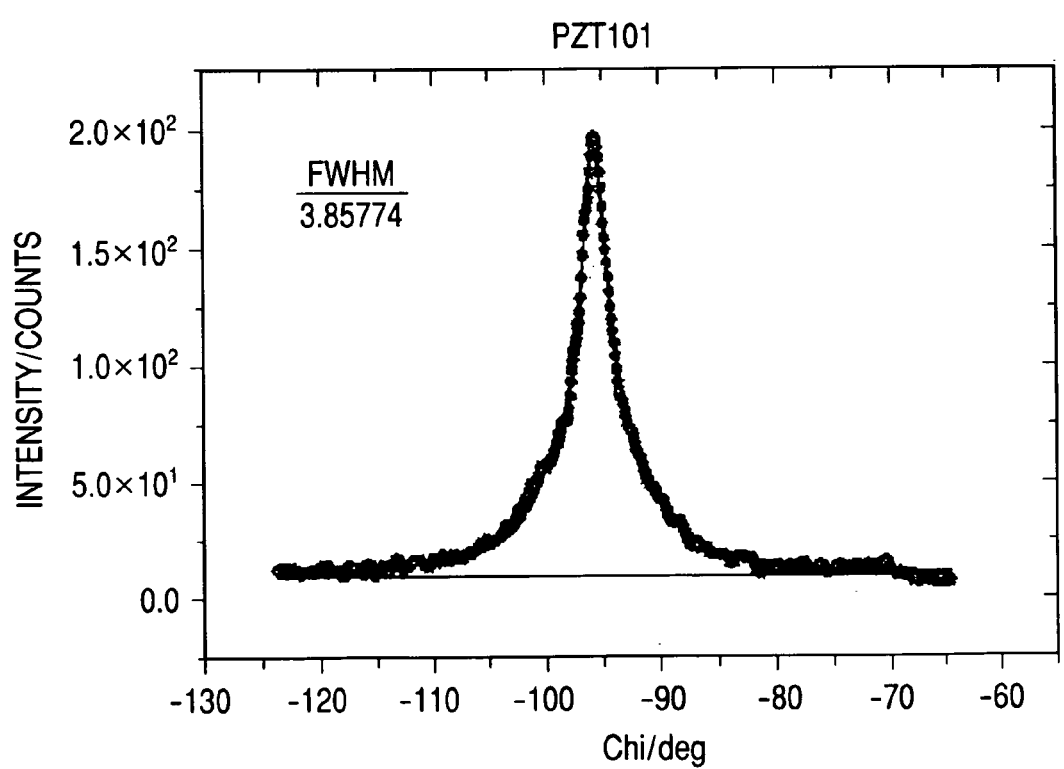
FIG. 11 shows half bandwidth data (results of fitting a pseudo-Voigt function for the peak in a reciprocal lattice map)
Figure 12:
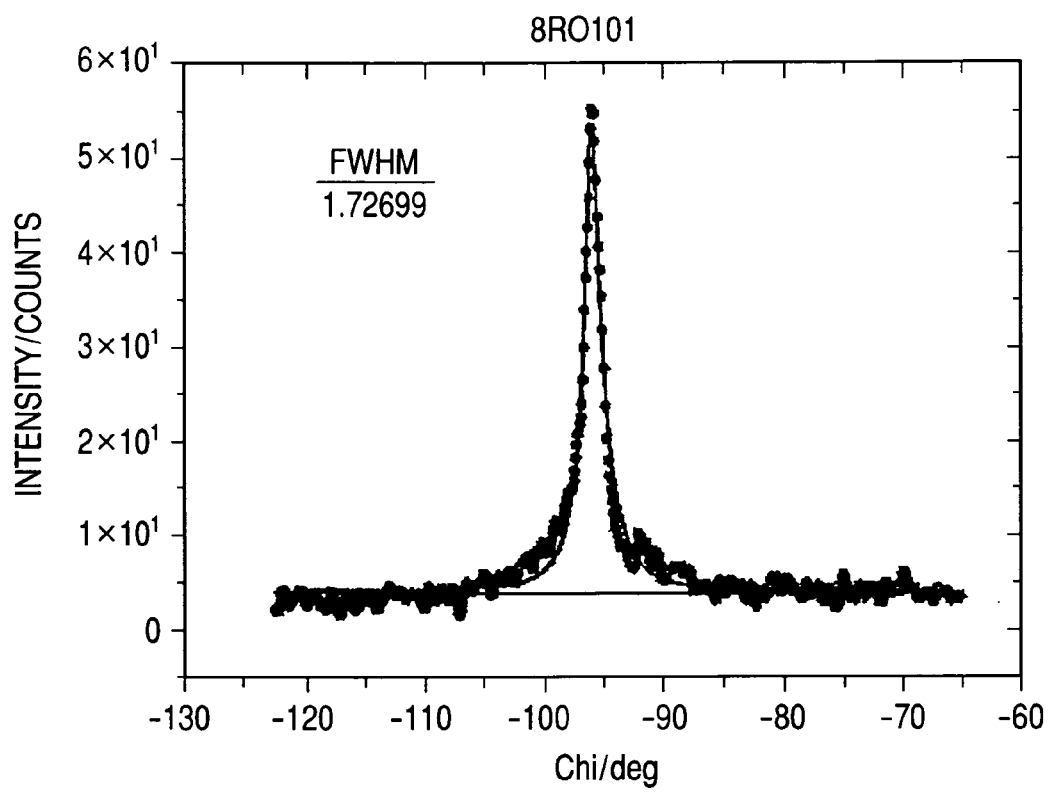
FIG. 12 shows half bandwidth data (results of fitting a pseudo-Voigt function for the peak in a reciprocal lattice map)
Figure 13:
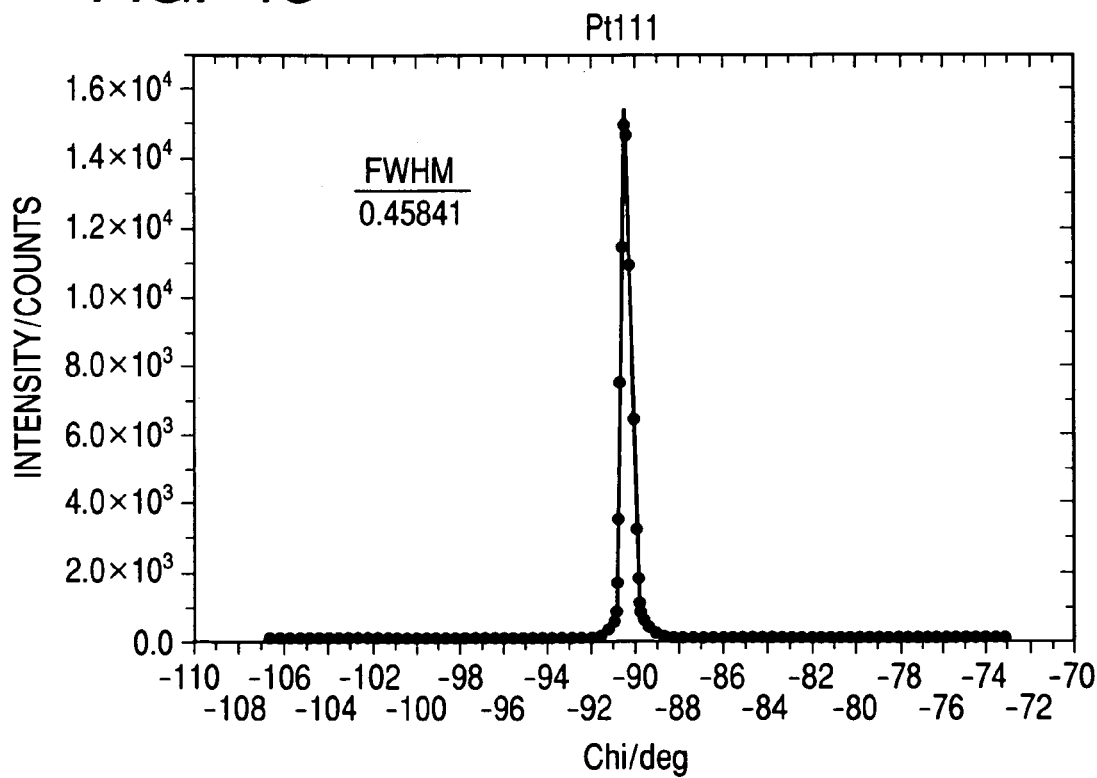
FIG. 13 shows half bandwidth data (results of fitting a pseudo-Voigt function for the peak in a reciprocal lattice map).

A Si substrate, coated with a 100 nm thick thermally oxidized $SiO_2$ layer, was coated with a 100 nm thick Pt layer as a first electrode layer by sputtering while controlling the substrate at 300° C., then with a 15 nm thick $SrRuO_3$ (SRO) layer by a pulsed MO-CVD process while controlling the substrate at 600° C., and with a 290 nm thick dielectric layer of $Pb(Zr, Ti)O_3$ (Zr/Ti ratio: 47/53) also by a pulsed MO-CVD process while controlling the substrate at 500° C. The laminate thus produced had an XRD-determined degree of crystal orientation of 99% or more in the (111) direction running in parallel to the substrate surface. Half-value breadths f3, f2 and f1 of the respective dielectric, second electrode and first electrode layers in the laminate were 3.9, 1.7 and 0.46°, determined by fitting a pseudo-Voigt function, as shown in FIGS. 11 to 13. The dielectric and second electrode layers were analyzed using the (101) peak, as described earlier.

The laminate was then coated with a 100 nm thick SRO layer as an upper electrode, to produce the dielectric element of the present invention. It had a remanent polarization 2Pr of 47 $\mu C/cm^2$ and coercive force Ec of 71 kV/cm, determined by the electrical analysis. These properties are sufficient to make the element useful for ferroelectric memories.

EXAMPLE 2

Next, the dielectric element of the present invention to be used as a piezoelectric element is described.

Figure 2:
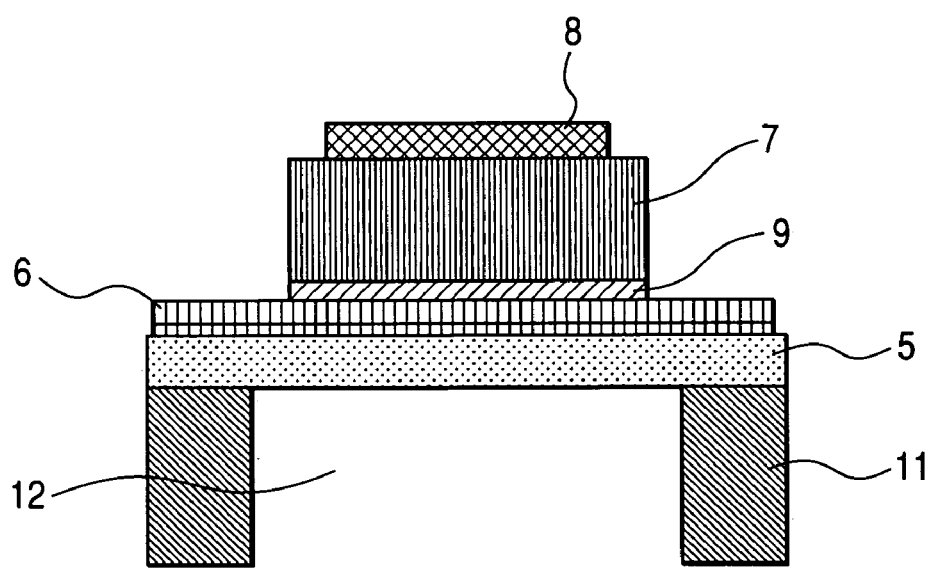
FIG. 2 is a cross-sectional view of piezoelectric element.
Figure 3A:
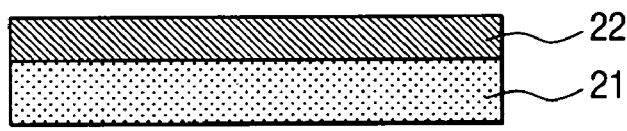
FIGS. 3A, 3B, 3C and 3D are schematic views for showing a process for producing the dielectric element of the present invention.
Figure 3B:
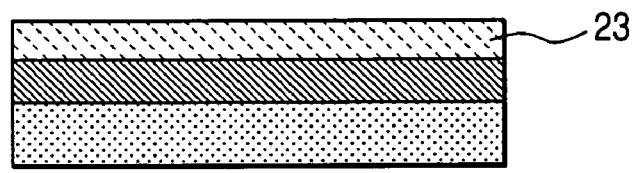
Figure 3C:
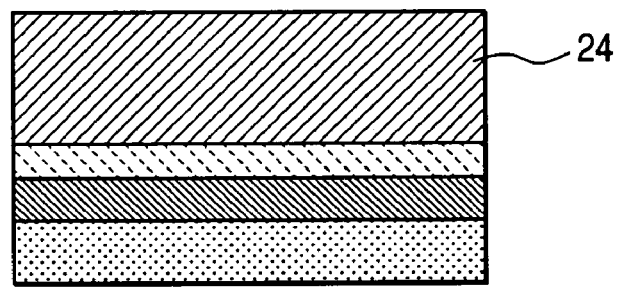
Figure 3D:
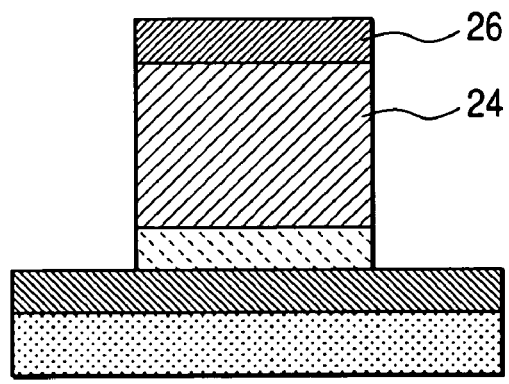

A 200 $\mu m$ thick (110)-oriented Si substrate was coated with a 1.5 $\mu m$ thick SiN layer by sputtering; 5 nm thick Ti layer as an anchor layer and 50 nm thick Ir electrode layer by rf sputtering while controlling the substrate at 200° C.; 100 nm thick SRO layer as a second electrode layer also by rf sputtering while controlling the substrate at 600° C.; 2.5 $\mu m$ thick piezoelectric layer of $Pb(Zr, Ti)O_3$ (Zr/Ti ratio: 48/52); and a Pt/Cr layer as an upper electrode, where the piezoelectric layer was patterned with 45 $\mu m$ wide, 3 mm long rectangles. The Si substrate was partly removed by wet etching to form 58 $\mu m$ wide, 2.2 mm long individual liquid chambers, to produce the piezoelectric element with the discharge ports arranged at pitches of 84 $\mu m$. FIG. 2 is a cross-sectional view of the piezoelectric element for one patterning. The first electrode layer sufficiently worked as an etching stop layer in the production process. The piezoelectric element exhibited a good displacement of 0.15 m, when a voltage of 20 V was applied thereto.

All of the PZT, SRO and Ir layers which constituted the piezoelectric element had a degree of crystal orientation of 99% or more in the (111) direction, and half bandwidths f1, f2 and f3 of 0.53, 2.1 and 4.5°, determined in the same manner as in EXAMPLE 1.

Figure 10:
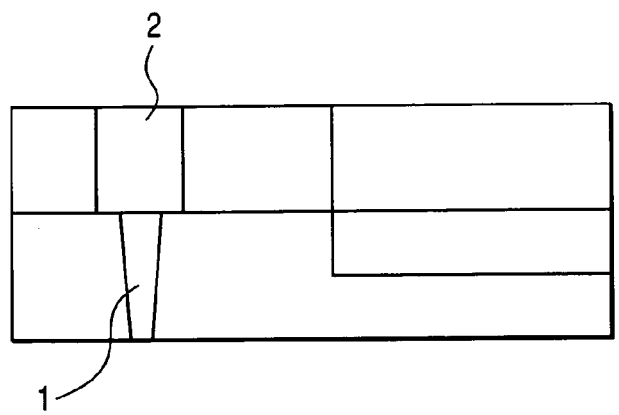
FIG. 10 is a cross-sectional view of a substrate comprising a liquid passage and discharge port in communication with each other.

The stainless steel substrate provided with the liquid passage 2, discharge port 1 and ink supply passage (FIG. 10) was joined in the above element, to produce the ink jet head of the present invention.

The element was confirmed to discharge liquid droplets smoothly at a driving voltage of 20 V. It was also confirmed that characteristic variations were limited port by port and device by device.

EXAMPLE 3

Next, another embodiment of the method of the present invention for producing a dielectric element is described. It adopted a process different from that for EXAMPLE 2.

A (110)-oriented Si substrate was coated with a 100 nm thick Pt layer as a first electrode layer (substrate temperature controlled at 250° C.), 60 nm thick $LaNiO_3$ layer as a second electrode layer and 3.0 $\mu m$ thick $Pb(Zr, Ti)O_3$ (Zr/Ti ratio: 50/50) layer as a piezoelectric layer while controlling the substrate at T1 of room temperature, T2 of 650° C. and T3 of 520° C. The piezoelectric layer was coated with a 200 nm thick Pt/Ti electrode layer and 2.0 $\mu m$ thick SiN layer as a vibrator. The substrate was joined to a second Si substrate, prepared to have a condition illustrated in FIG. 6E, at 150° C. via an Au layer. After joining, the (100)-oriented Si substrate was removed by etching with an alkali. The first and second electrode layers were patterned by ICP. The piezoelectric layer was patterned by etching with a mixed acid as an etchant, to be left on the individual liquid chambers. The resulting laminate was joined to a stainless steel (SUS) plate provided with discharge ports of 20 $\mu m$ in diameter, to produce the ink jet head of the present invention. The discharge characteristics were evaluated, and the results similar to those observed in EXAMPLE 2 were produced.

The first electrode layer, second electrode layer and piezoelectric layer had a degree of crystal orientation of 99% in the (111) direction, and half bandwidths f1, f2 and f3 of 0.56, 2.0 and 3.3°. The ink jet head with the first electrode layer replaced by a (110)-oriented Si substrate exhibited characteristics not different much.

EXAMPLE 4 AND COMPARATIVE EXAMPLE 1

A Si substrate coated with a 20 nm thick $SiO_2$ layer was coated with a $TiO_2$ layer, and then with a 70 nm thick (111)-oriented Pt layer while controlling the substrate at 200° C. The resulting laminate was then coated with a 300 nm thick (111)-oriented PZT (Zr/Ti ratio: 40/60) layer either directly or via a 40 nm thick (111)-oriented SRO layer by a pulsed MO-CVD process while controlling the substrate at 500° C., to evaluate the ferroelectric characteristics. The SRO film was provided while controlling the substrate at 600° C. The resultant piezoelectric element of the present invention with the SRO layer had a remanent polarization 2Pr of 44 $\mu C/cm^2$, whereas the SRO-free one had a value of 21 $\mu C/cm^2$. The layers had half bandwidths f1, f2 and f3 of 0.63, 2.9 and 4.4°.

COMPARATIVE EXAMPLE 2

A substrate of (111)-oriented, single-crystal MgO was coated with a 100 nm thick Pt layer by sputtering while controlling the substrate at 600° C. to form the (111)-oriented layer thereon. It was then coated with a 15 nm thick SRO layer while controlling the substrate at 650° C. and then with a PZT (Zr/Ti ratio: 48/52) layer while controlling the substrate at 600° C. by sputtering for both layers. These layers had half bandwidths f1, f2 and f3 of 0.09, 0.48 and 1.5°. The half bandwidth of the PZT layer was fairly wide. The laminate showed exfoliation in places, when joined to a second substrate in the same manner as in EXAMPLE 3, and needed some improvement. It was also observed that crystallinity of the PZT layer varied widely, when it was directly in contact with the Pt layer, i.e., without a $PbTiO_3$ layer in-between.

EXAMPLE 5 AND COMPARATIVE EXAMPLE 2

A (100)-oriented Si substrate was rinsed (treated) to remove a surface oxide layer, and then with $H_2O_2$ to form an oxide layer thereon. It was coated with a Zr layer by sputtering with a metal target while controlling the substrate at 800° C., and then with a YSZ layer with a target containing the Y component at 30%. The YSZ layer was a (100)-oriented, single-crystal, epitaxial layer.

The substrate coated with these layers to a total thickness of 30 to 60 nm was coated with a 50 to 80 nm Pt layer while controlling the substrate at 60° C. The Pt layer had a half bandwidth f1 of 0.10°. It was further coated with a 150 nm thick SRO layer while controlling the substrate at 600° C. Both Pt and SRO layers were (111)-oriented and single-crystalline. A PZT layer was then formed on the above laminate. It was found that the (111)-oriented and single-crystalline could be formed. For comparison, a (111)-oriented, SRO-free Pt layer was coated with a PZT layer. However, the PZT layer was not single-crystalline, randomly oriented in the in-plane direction and containing a (110) component in the out-of-plane direction.

These layers were kept single-crystalline up to the dielectric layer at the sacrifice of single-crystallinity to a half bandwidth f1 (determined for the (111)-oriented, single-crystal Pt layer) of 3.0°. However, single-crystallinity was no longer observed at above 3.0°, and the dielectric layer was not monoaxially oriented but had one or more peaks of other orientation(s).

This application claims priority from Japanese Patent Application No. 2004-004748 filed Jan. 9, 2004, which is hereby incorporated by reference herein.

What is claimed is:

1. A dielectric element comprising a lower electrode layer, a perovskite dielectric layer and an upper electrode layer in this order on a substrate, wherein
    at least one of the lower and upper electrode layers comprises a first electrode layer mainly composed of a metal and a second electrode layer mainly composed of a perovskite oxide, said second electrode layer being formed at a side of said dielectric layer,
    each of the first electrode layer, second electrode layer and dielectric layer has a (111) preferentially or (111) uniaxially oriented crystal structure, and
    the first electrode layer, second electrode layer and dielectric layer satisfy the relationship represented by the general formula (1):

$$f3 > f2 > f1 \geq 0.1° \quad (1)$$

where f1, f2 and f3 are half bandwidths of the X-ray diffraction (XRD) peaks of the first electrode layer, second electrode layer and dielectric layer in the preferentially or uniaxially orientation axis, the breadth being determined by fitting a pseudo-Voigt function, and f1 is in a range from 0.1 to 10°.

2. The dielectric element according to claim 1, wherein the metal in the first electrode layer is a face-centered cubic crystal.

3. The dielectric element according to claim 1, wherein the second electrode layer has a half bandwidth f2 of the XRD peak in a range from 0.5 to 3.0°, determined by fitting a pseudo-Voigt function, in the (101) direction, which is not perpendicular to the second electrode layer surface.

4. The dielectric element according to claim 1, wherein the dielectric layer has a half bandwidth f3 of the XRD peak in a range from 1.0 to 6.0°, determined by fitting a pseudo-Voigt function, in the (101) direction, which is not perpendicular to the dielectric layer surface.

5. A dielectric element comprising a lower electrode layer, a dielectric layer and an upper electrode layer in this order on a substrate, wherein
    at least one of the lower and upper electrode layers comprises first and second electrode layers, the former being mainly composed of a face-centered cubic crystal metal which is (111)-oriented and having a half bandwidth of the XRD (111) peak in a range from 0.1 to 10°, determined by fitting a pseudo-Voigt function, and the latter being positioned adjacent to the first electrode layer, being mainly composed of a perovskite oxide which is oriented in the (111) direction and having a half bandwidth of the XRD (101) peak in a range from 0.5 to 11°, determined by fitting a pseudo-Voigt function, said second electrode layer being formed at a side of said dielectric layer, and
    the dielectric layer has a perovskite structure which is oriented in the (111) direction and has a half bandwidth of the XRD (101) peak in a range from 1.0 to 12°, determined by fitting a pseudo-Voigt function.

6. The dielectric element according to claim 5, wherein the substrate is made of silicon, and a $SiO_2$ layer is formed to a thickness of 5 nm or more as an intermediate layer on the substrate.

7. The dielectric element according to claim 1 or claim 5, wherein the dielectric layer has a crystal orientation degree of 80% or more in the (111) direction.

8. The dielectric element according to claim 7, wherein the dielectric layer has a crystal orientation degree of 99% or more in the (111) direction.

9. A dielectric element comprising a lower electrode layer, a dielectric layer and an upper electrode layer in this order on a substrate, wherein
    at least one of the lower and upper electrode layers comprises a first electrode layer mainly composed of a metal and a second electrode layer mainly composed of a perovskite oxide, said second electrode layer being formed at a side of said dielectric layer,
    the first electrode layer, second electrode layer and dielectric layer are each a single-crystal layer,
    the dielectric layer has a perovskite structure which is oriented in the (111) direction, and
    the first electrode layer, second electrode layer and dielectric layer satisfy the relationship represented by the general formula (1):

$$f3 > f2 > f1 \geq 0.1° \quad (1)$$

where f1, f2 and f3 are half bandwidths of the XRD peaks of the first electrode layer, second electrode layer and dielectric layer, the breadth being determined by fitting a pseudo-Voigt function, and f1 is in a range from 0.1 to 3°, inclusive.

10. A dielectric element comprising
a (100)-oriented single-crystal film containing $Y_2O_3$ at 1 to 20% by weight, inclusive, the balance being $ZrO_2$,
a (111)-oriented single-crystal electrode layer film formed of face-centered cubic crystal metal,
a (111)-oriented single-crystal electrode layer film formed of perovskite oxide, and
a (111)-oriented single-crystal film formed of perovskite oxide as a dielectric layer in this order on a (100)-oriented silicon substrate.

11. A piezoelectric element having the dielectric element according to one of claims 1, 5, 9 and 10.

12. An ink jet head comprising a liquid passage in communication with a discharge port from which a liquid is discharged and a piezoelectric element which gives energy to the liquid in the liquid passage for discharging it from the discharge port, wherein the piezoelectric element is the one according to claim 11.

13. A method for producing the dielectric element according to one of claims 1, 5, 9 and 10, wherein
the substrate temperature levels are set to satisfy the relationship represented by the general formula (2):

$$T2 \geq T3 > T1 \tag{2}$$

where T1 is the substrate temperature at which the first electrode layer is formed, T2 is the substrate temperature at which the second electrode layer is formed, and T3 is the substrate temperature at which the dielectric layer is formed.

* * * * *

UNITED STATES PATENT AND TRADEMARK OFFICE
CERTIFICATE OF CORRECTION

| | |
|---|---|
| PATENT NO. | : 7,262,544 B2 |
| APPLICATION NO. | : 11/024961 |
| DATED | : August 28, 2007 |
| INVENTOR(S) | : Aoki et al. |

It is certified that error appears in the above-identified patent and that said Letters Patent is hereby corrected as shown below:

COLUMN 2:
Line 13, "method." should read --method--.
Line 58, "layers," should read --layer,--.

COLUMN 6:
Line 27, "layers," should read --layer,--.

COLUMN 7:
Line 25, "well reproducibly" should read --good reproducibility--.
Line 39, "(111)-oriented, and so is on" should read --(111)-oriented as in--.
Line 50, "$Gd_{1-x} Sr_x VO_3$" should read --$Gd_{1-x}Sr_x VO_3$--.
Line 59, "$BaTiO_3$—" should read --$BaTiO_3$- --.
Line 60, "$SrTiO_3$—" should read --$SrTiO_3$- --.

COLUMN 8:
Line 36, "laminate" should read --a laminate--.
Line 37, "a" should be deleted.

COLUMN 9:
Line 59, "of" should read --a--.
Line 65, "layer layers" should read --layers--.

COLUMN 12:
Line 19, "include." should read --include--.

UNITED STATES PATENT AND TRADEMARK OFFICE
CERTIFICATE OF CORRECTION

PATENT NO. : 7,262,544 B2
APPLICATION NO. : 11/024961
DATED : August 28, 2007
INVENTOR(S) : Aoki et al.

It is certified that error appears in the above-identified patent and that said Letters Patent is hereby corrected as shown below:

COLUMN 14:
Line 46, "not different much." should read --is not much different.--.

Signed and Sealed this

Tenth Day of March, 2009

JOHN DOLL
*Acting Director of the United States Patent and Trademark Office*